(12) United States Patent
Pangrle et al.

(10) Patent No.: US 8,012,673 B1
(45) Date of Patent: Sep. 6, 2011

(54) PROCESSING A COPOLYMER TO FORM A POLYMER MEMORY CELL

(75) Inventors: Suzette K. Pangrle, Cupertino, CA (US); Matthew S. Buynoski, Palo Alto, CA (US); Nicholas H. Tripsas, San Jose, CA (US); Uzodinma Okoroanyanwu, Clifton Park, NY (US)

(73) Assignee: Spansion LLC, Sunnyvale, CA (US)

( * ) Notice: Subject to any disclaimer, the term of this patent is extended or adjusted under 35 U.S.C. 154(b) by 1954 days.

(21) Appl. No.: 11/068,674

(22) Filed: Mar. 1, 2005

(51) Int. Cl.
  *H01L 21/02* (2006.01)
(52) U.S. Cl. .................. 430/311; 430/313; 430/315
(58) Field of Classification Search .................. None
  See application file for complete search history.

(56) References Cited

U.S. PATENT DOCUMENTS

| | | | |
|---|---|---|---|
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B2 | 7/2004 | Krieger et al. | |
| 6,770,905 B1 | 8/2004 | Buynoski et al. | |
| 6,773,954 B1 | 8/2004 | Subramanian et al. | |
| 6,781,868 B2 | 8/2004 | Bulovic et al. | |
| 6,787,458 B1 | 9/2004 | Tripsas et al. | |
| 6,803,267 B1 | 10/2004 | Subramanian et al. | |
| 6,825,060 B1 | 11/2004 | Lyons et al. | |
| 6,852,586 B1 | 2/2005 | Buynoski et al. | |
| 6,858,481 B2 | 2/2005 | Krieger et al. | |
| 2004/0137241 A1* | 7/2004 | Lin et al. ...................... 428/447 |

* cited by examiner

*Primary Examiner* — Daborah Chacko-Davis
(74) *Attorney, Agent, or Firm* — Turocy & Watson, LLP (57) ABSTRACT

Disclosed are organic semiconductor devices containing a copolymer layer that contains a polymer dielectric and a semiconducting polymer formed using actinic radiation. As initially formed, the copolymer layer has dielectric properties, but portions may selectively rendered conductive after those portions are exposed to actinic radiation. Also disclosed are methods of making the organic semiconductor devices. Such devices are characterized by light weight and robust reliability.

20 Claims, 3 Drawing Sheets

PROCESSING A COPOLYMER TO FORM A POLYMER MEMORY CELL

TECHNICAL FIELD

The present invention generally relates to polymer memory cells made with a dielectric layer, a portion of which can be selectively transformed into a semiconducting polymer.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed.

Electronic addressing or logic devices, for instance those used for storage or processing of data, are typically made with inorganic solid state technology, and particularly crystalline silicon devices. The metal oxide semiconductor field effect transistor (MOSFET) is a fundamental building block.

Much of the progress in making computers and memory devices faster, smaller and cheaper involves integration, squeezing ever more transistors and other electronic structures onto a postage-stamp-sized piece of silicon. A postage-stamp-sized piece of silicon may contain tens of millions of transistors, each transistor as small as a few hundred nanometers. However, silicon-based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as inorganic solid state device sizes decrease and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge.

Continuing demand for smaller and lighter electronics has created a need for advanced materials and designs. This is because current trends in electron markets, such as the growing demand for wireless communications and portable computing, are placing an increasing emphasis on smaller/lighter device features and faster operating speeds. To ensure reliable operation of an electronic circuit, proper electrical isolation between adjacent conductors must be achieved. Proper electrical isolation mitigates high voltage arcing and leakage currents, which can be exacerbated at high frequencies.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides efficient methods of making polymer memory chips/devices. Use of material that can function as a dielectric or semiconductor depending upon the use of a certain stimuli substantially simplifies fabrication. Moreover, the present invention provides polymer memory chips/devices that are relatively light weight and flexible owing to the presence of polymer dielectrics and conductive polymers/organic semiconductors.

One aspect of the present invention relates to methods of making memory devices involving forming a copolymer layer over an electrode, passive layer, and insulating material, the copolymer layer containing a polymer dielectric and a semiconducting polymer precursor, the copolymer layer having dielectric properties; exposing a portion of the copolymer layer to actinic radiation thereby forming a semiconducting polymer in the exposed portions of the copolymer layer; and forming another electrode over exposed portions of the copolymer layer containing the semiconducting polymer. Another aspect of the present invention relates to patterning an ARC over the copolymer layer so that openings in the ARC are positioned at least partially above the electrode; and then exposing a portion of the copolymer layer through openings in the ARC to actinic radiation to form a semiconducting polymer in the exposed portions of the copolymer layer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The present invention involves using a layer containing both a polymer dielectric and a semiconductive polymers. The polymer dielectrics and conductive polymers are combined/formed in a single layer, and left untreated, the layer functions as a dielectric material. However, when exposed to actinic radiation (or those portions that are exposed to actinic radiation), the layer functions as an organic semiconductor. Thus a single polymeric layer, depending upon whether or not it (or a potion thereof) is subjected to an irradiation treatment, can be used as two different elements within the subsequently formed memory devices. In this connection, the present invention provides simplified methods of making polymer memory chips. The present invention also provides polymer memory chips that are light in weight, semiflexible in constitution and where the coefficients of thermal expansion of the polymer dielectric and conductive polymers are substantially matched.

The integrated circuit chips made in accordance with the present invention contain a copolymer layer containing a polymer dielectric and a semiconducting polymer or a precursor compound that can form a semiconducting polymer in response to an external stimuli, such as actinic radiation. The semiconducting polymer and/or a precursor compound that can form a semiconducting polymer in response to irradiation and initially deposited on a substrate in the copolymer layer are hereby termed a semiconducting polymer precursor. The polymer dielectric has relatively light weight and a coefficient of thermal expansion that substantially matches the semiconducting polymer. Consequently, fabrication of the polymer memory devices is simplified, costs are reduced, and changes in temperature do not deleteriously effect the performance, reliability, and/or mechanical integrity of the integrated circuit chips that contain the polymer memory devices.

Polymer dielectrics are insulation materials, such as low k materials (a material with a low dielectric constant). Low k materials provide electrical insulation between various layers, devices, structures, and regions within semiconductor substrates. For purposes of this invention, low k materials have a dielectric constant below about 3. In another embodiment, low k materials have a dielectric constant below about 2.4. In yet another embodiment, low k materials have a dielectric constant below about 1.8. In still yet another embodiment, low k materials have a dielectric constant below about 1.5.

General examples of polymer dielectrics include low k polymers and low k fluoropolymers. Examples of polymer dielectric include polyimides, fluorinated polyimides, polysilsesquioxanes such as hydrogen polysilsesquioxanes, methyl polysilsesquioxanes, butyl polysilsesquioxanes, and phenyl polysilsesquioxanes, benzocyclobutenes (BCB), fluorinated benzocyclobutene, polyphenylene, polysilazanes, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fluorinated poly(arylene ether), fluorinated parylenes, poly(p-xylxylenes), fluorinated poly(p-xylxylenes), parylene F, parylene N, parylene C, parylene D, amorphous polytetrafluoroethylene, polyquinoline, polyphenylquinoxalines, polymeric photoresist materials, and the like.

Specific examples of a commercially available polymer dielectric include those under the trade designations FLARE™ from AlliedSignal, believed to be derived from perfluorobiphenyl and aromatic bisphenols; Black Diamond™ from Applied Materials; CYTOP fluoropolymer and ALCAP-S from Asahi Chemical; SiLK® and CYCLOTENE® BCB from Dow Chemical; KAPTON® polyimides and IMIDEX® polyimides available from DuPont; ZIRKON from Shipley; TEFLON® polytetrafluoroethylene from DuPont; XLK and 3MS from Dow Corning; HSG RZ25 from Hitachi Chemical; HOSP™ and NANOGLASS™ from Honeywell Electronic Materials; LKD from JSR Microelectronics; CORAL™ and AF4 from Novellus; SPINFIL™ polysilazanes and PIMEL® polyimides from Clariant; and VELOX™ PAE-2 from Schumacher.

In one embodiment, the copolymer layer contains from about 50% to about 90% by weight of a polymer dielectric and from about 10% to about 50% by weight of a semiconducting polymer or a precursor compound that can form a semiconducting polymer. In another embodiment, the copolymer layer contains from about 55% to about 85% by weight of a polymer dielectric and from about 15% to about 45% by weight of a semiconducting polymer or a precursor compound that can form a semiconducting polymer. In yet another embodiment, the copolymer layer contains from about 60% to about 80% by weight of a polymer dielectric and from about 20% to about 40% by weight of a semiconducting polymer or a precursor compound that can form a semiconducting polymer.

Semiconducting polymer or a precursor compound that can form a semiconducting polymer generally include polymers with variable electric conductivity, and monomers that can form polymers with variable electric conductivity. In one embodiment, the semiconducting polymer contains a conjugated organic polymer. In another embodiment, the semiconducting polymer contains a conjugated organic polymer with an aromatic group within its repeating unit.

Examples of polymers with variable electrical conductivity include polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)phenylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

The copolymer layer is typically formed using spin-on deposition techniques. Spin-on techniques involve depositing a mixture of the polymer dielectric, semiconducting polymer, and/or semiconducting polymer precursor, and a solvent, then removing the solvent from the substrate/electrode. Solvents useful for this purpose include one or more of glycol ether esters, glycol ethers, furans, and alkyl alcohols containing from about 4 to about 7 carbon atoms. Two or more of glycol ether esters, glycol ethers, furans, and alkyl alcohols containing from about 4 to about 7 carbon atoms may be employed as a solvent system. The solvent system may contain one or more of glycol ether esters, glycol ethers, furans, and alkyl alcohols, and another organic solvent.

In one embodiment, the mixture contains from about 0.1% to about 75% by weight of copolymer material (dielectric and semiconducting polymer materials) and from about 25% to about 99.9% by weight of solvent (one or more of glycol ether esters, glycol ethers, furans, and alkyl alcohols). In another embodiment, the mixture contains from about 0.5% to about 50% by weight of the copolymer material and from about 50% to about 99.5% by weight of solvent. In yet embodiment, the mixture contains from about 1% to about 25% by weight of the copolymer material and from about 75% to about 99% by weight of solvent.

Before exposing portions of the copolymer layer to actinic radiation, the copolymer material/layer has dielectric or insulating properties. In one embodiment, the copolymer material/layer as initially formed and before exposure to actinic radiation has a dielectric constant below about 3. In another embodiment, the copolymer material/layer as initially formed and before exposure to actinic radiation has a dielectric constant below about 2.4. In yet another embodiment, the copolymer material/layer as initially formed and before exposure to actinic radiation has a dielectric constant below about 1.8. In still yet another embodiment, the copolymer material/layer as initially formed and before exposure to actinic radiation has a dielectric constant below about 1.5.

After the copolymer material is deposited over the substrate, a portion of the copolymer layer is exposed to actinic radiation so that the semiconducting polymer fully forms in the exposed portions. The regions exposed to the actinic radiation lose their insulating properties and transform into semiconducting regions. A patterned antireflection coating (ARC) and/or patterned photoresist facilitates exposing selected portions of the copolymer layer to actinic radiation. The ARC prevents exposure of the insulating regions of the copolymer layer to the actinic radiation, and thus permits the insulating regions of the copolymer layer to retain their dielectric properties.

The actinic radiation has a wavelength or wavelength range suitable to induce formation of semiconducting polymers in the exposed portions of the copolymer layer. In one embodiment, the actinic radiation has a wavelength from about 1 nm to about 1,000 nm. In another embodiment, the actinic radiation has a wavelength from about 100 nm to about 500 nm. In yet another embodiment, the actinic radiation has a wavelength from about 200 nm to about 400 nm.

Polymeric materials generally have lighter weight and higher coefficients of thermal expansion than inorganic materials commonly employed in semiconductor devices, such as polysilicon, silica, other metal oxides, and silicon nitride. The coefficient of thermal expansion is generally defined as the fractional increase in length per unit rise in temperature. Thus, compared to devices made with inorganic dielectric materials and silicon based semiconducting materials, the polymer memory cells of the present invention are light weight.

The polymer memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like.

Figure 1:
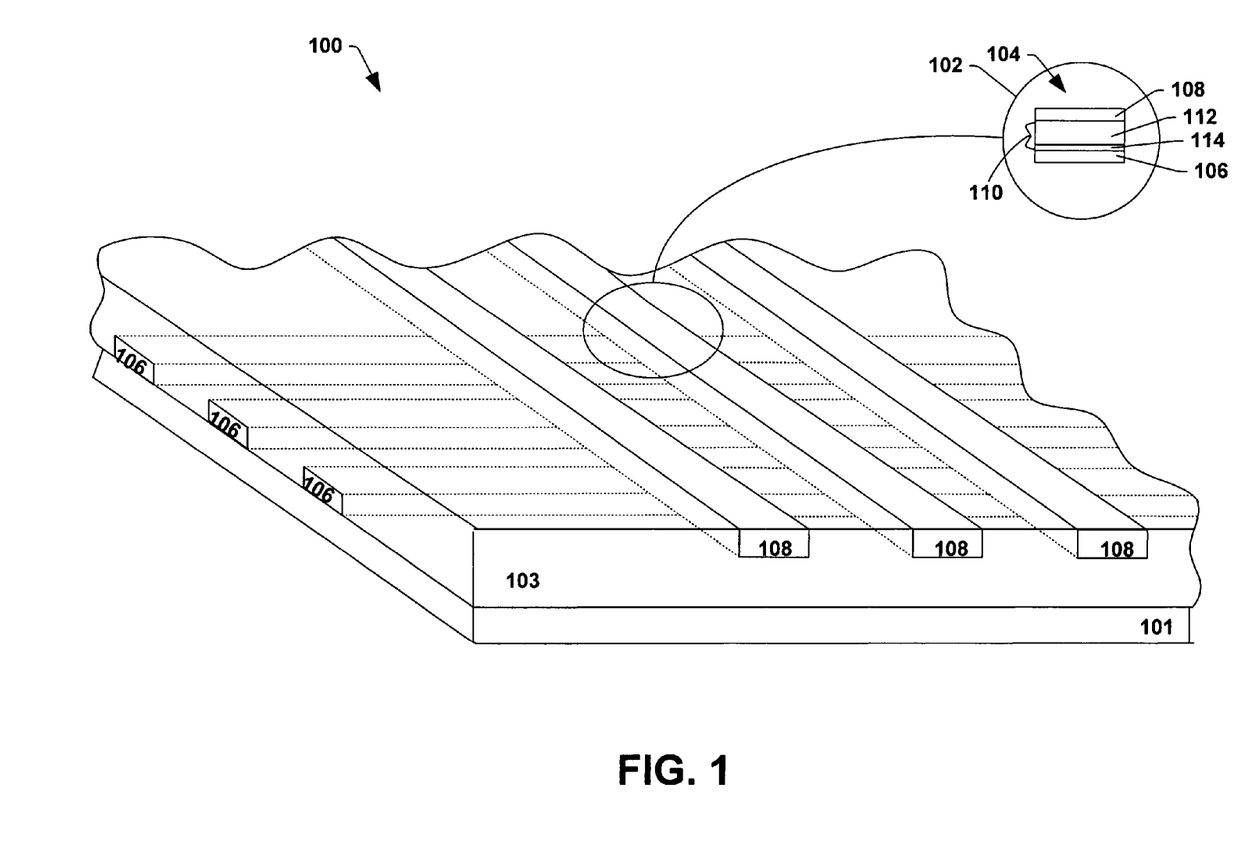
FIG. 1 illustrates a perspective view of a two dimensional microelectronic device containing a plurality of polymer memory cells in accordance with one aspect of the invention.

Referring to FIG. 1, a brief description of an organic polymer memory device 100 containing a plurality of polymer memory cells positioned on or over a substrate 101 in accordance with one aspect of the invention is shown, as well as an exploded view 102 of an exemplary polymer memory cell 104. The organic polymer memory device 100 contains a desired number of polymer memory cells, as determined by the number of rows, columns, and layers present positioned on a substrate 101. The polymer memory cells are formed at least partially in a polymer dielectric 103. The first electrodes 106 and the second electrodes 108 are shown in substantially perpendicular orientation, although other orientations are possible to achieve the structure of the exploded view 102. Each polymer memory cell 104 contains a first electrode 106 and a second electrode 108 with a controllably conductive media 110 therebetween. The controllably conductive media 110 contains a copolymer containing a semiconducting polymer 112 and passive layer 114. Peripheral circuitry and devices are not shown for brevity.

Specific examples of materials for the electrode include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Mondel®, Inconel®, brass, stainless steel, magnesium-silver alloy, and various other alloys.

In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

Active devices of polymer memory devices contain the aforementioned copolymer layer that is treated with actinic radiation and a passive layer, which can constitute a controllably conductive media. The controllably conductive media can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains a copolymer layer containing a semiconducting polymer (activated portion of the copolymer layer) and a passive layer. The passive layer contains a conductivity facilitating compound. The copolymer layer thus has a carbon based structure, often a carbon-hydrogen based structure, which is different from conventional MOSFETs. The semiconducting polymer materials are typically characterized in that they have overlapping π orbitals, and/or in that they have at least two stable oxidation states. The semiconductor polymer materials are also characterized in that they may assume two or more resonant structures. The overlapping π orbitals contribute to the controllably conductive properties of the controllably conductive media. The amount of charge injected into the semiconducting polymer layer also influences the degree of its conductivity.

In this connection, the semiconducting polymer layer, such as a copolymer layer containing a conjugated organic polymer, has the ability to donate and accept charges (holes and/or electrons). Generally, the copolymer layer or an atom/moiety in the semiconducting polymer has at least two relatively stable states. The two relatively stable oxidation states permit the semiconducting polymer to donate and accept charges and electrically interact with the conductivity facilitating compound. The ability of the copolymer layer to donate and accept charges and electrically interact with the passive layer also depends on the identity of the conductivity facilitating compound.

In one embodiment, the copolymer layer containing the semiconducting polymer has a thickness of about 0.001 μm or more and about 5 μm or less. In another embodiment, the copolymer layer has a thickness of about 0.01 μm or more and about 2.5 μm or less. In yet another embodiment, the copolymer layer has a thickness of about 0.05 μm or more and about 1 μm or less.

A covalent bond may be formed between the copolymer layer containing the semiconducting polymer and the passive layer. Alternatively, close contact is required to provide good charge carrier/electron exchange between the copolymer layer and the passive layer. The copolymer layer and the passive layer are electrically coupled in that charge carrier/electron exchange occurs between the two layers.

A passive layer contains at least one conductivity facilitating compound that contributes to the controllably conductive properties of the controllably conductive media. The conductivity facilitating compound, formed by implantation, has the ability to donate and accept charges (holes and/or electrons) and/or act as a source of copper ions. The passive layer thus may transport holes, electrons, and/or ions between an electrode and the organic polymer layer/passive layer interface, facilitate charge/carrier injection into the organic polymer layer, and/or increase the concentration of a charge carrier (ions, holes and/or electrons) in the organic polymer layer. In some instances, the passive layer may store opposite charges thereby providing a balance of charges in the organic memory device as a whole. Storing charges/charge carriers is facilitated by the existence of two relatively stable oxidation states for the conductivity facilitating compound.

The applied external field can reduce the energy barrier between the passive layer and copolymer layer depending on the field direction. Therefore, enhanced charge injection in the forward direction field in programming operation and also enhanced charge recombination in reversed field in erase operation can be obtained.

The passive layer may in some instances act as a catalyst when forming the semiconducting polymers of the copolymer layer, particularly when the semiconducting portion of the copolymer layer contains a conjugated organic polymer. In this connection, the polymer backbone of the conjugated organic polymer may initially form adjacent the passive layer, and grow or assemble away and substantially perpendicular to the passive layer surface during exposure to actinic radiation. As a result, the polymer backbones of the semiconducting polymers may be self aligned in a direction that traverses the electrodes or in a direction away from the passive layer.

Examples of conductivity facilitating compounds that may constitute the passive layer include one or more of copper sulfide ($Cu_2S$, $CuS$), copper rich copper sulfide ($Cu_3S$, $CuS$; $Cu_3S$, $Cu_2S$), copper oxide ($CuO$, $Cu_2O$), copper selenide ($Cu_2Se$, $CuSe$), copper telluride ($Cu_2Te$, $CuTe$), manganese oxide ($MnO_2$), titanium dioxide ($TiO_2$), indium oxide ($I_3O_4$), silver sulfide ($Ag_2S$, $AgS$), gold sulfide ($Au_2S$, $AuS$), iron oxide ($Fe_3O_4$), cobalt arsenide ($CoAs_2$), nickel arsenide ($NiAs$), and the like. The conductivity facilitating compounds do not necessarily dissociate into ions under the strength of the electric field, although ions may move through them. The passive layer may contain two or more subpassive layers, each sublayer containing the same, different, or multiple conductivity facilitating compounds.

The passive layer is grown using oxidation techniques, formed via gas phase reactions, implantation techniques, or deposited on/between electrodes. In some instances, to promote long charge retention times (in the copolymer layer), the passive layer may be treated with a plasma after it is formed. The plasma treatment modifies the energy barrier of the passive layer.

In one embodiment, the passive layer containing the conductivity facilitating compound has a thickness of about 2 Å or more and about 0.1 μm or less. In another embodiment, the passive layer has a thickness of about 10 Å or more and about 0.01 μm or less. In yet another embodiment, the passive layer has a thickness of about 50 Å or more and about 0.005 μm or less.

Operation of the organic memory devices/cells is facilitated using an external stimuli to achieve a switching effect. The external stimuli include an external electric field and/or light radiation. Under various conditions, the polymer memory cell is either conductive (low impedance or "on" state) or non-conductive (high impedance or "off" state).

The polymer memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single polymer memory cell, such as 2 or more bits of information or 4 or more bits of information.

Switching the polymer memory cell to the "on" state from the "off" state occurs when an external stimuli such as an applied electric field exceeds a threshold value. Switching the polymer memory cell to the "off" state from the "on" state occurs when an external stimuli does not exceed a threshold value or does not exist. The threshold value varies depending upon a number of factor including the identity of the materials that constitute the polymer memory cell and the passive layer, the thickness of the various layers, and the Generally speaking, the presence of an external stimuli such as an applied electric field that exceeds a threshold value ("programming" state) permits an applied voltage to write or erase information into/from the polymer memory cell and the presence of an external stimuli such as an applied electric field that is less than a threshold value permits an applied voltage to read information from the polymer memory cell; whereas external stimuli that do not exceed a threshold value do not write or erase information into/from the polymer memory cell.

To write information into the polymer memory cell, a voltage or pulse signal that exceeds the threshold is applied. To read information written into the polymer memory cell, a voltage or electric field of any polarity is applied. Measuring the impedance determines whether the polymer memory cell is in a low impedance state or a high impedance state (and thus whether it is "on" or "off"). To erase information written into the polymer memory cell, a negative voltage opposite in polarity to the writing signal, that exceeds a threshold value, is applied.

Figure 2:
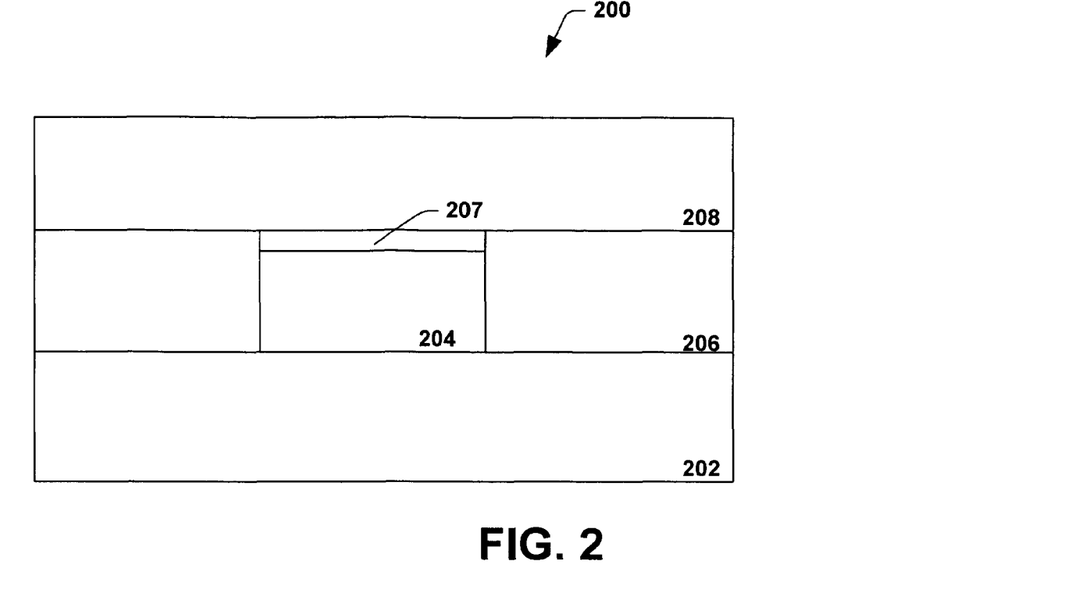
FIG. 2 illustrates a cross sectional illustration of a method of making a polymer memory cell in accordance with another aspect of the invention.

The present invention may be further understood and its advantages further appreciated in conjunction with FIGS. 2 to 5. Referring to FIG. 2, a semiconductor structure 200 is provided that contains a substrate 202, a conductive electrode 204 and a dielectric 206 over the substrate 202. The electrode 204 is positioned within the dielectric 206. Substrate 202 may include any suitable semiconductor substrate, for example, a monocrystalline silicon substrate, a plastic substrate, or alternatively, contain any number of structures and/or devices. The electrode 204 contains any of the materials described above, such as conductive metals such as copper and copper alloys, conductive plastics, and the like. The dielectric 206 may contain any organic (polymeric) or inorganic (silica, silicon nitride, etc.) dielectric material. A passive layer 207 is formed over the upper surface of the conductive electrode 204 using oxidation, chemical reaction, CVD, or implantation techniques. Using spin on techniques, a copolymer layer 208 is formed over the conductive electrode 204 and the dielectric 206. As initially formed, the copolymer layer 208 contains a polymer dielectric and a semiconducting polymer (or precursor that can form a semiconducting polymer). Further as initially formed, the entire copolymer layer 208 has dielectric properties.

Figure 3:
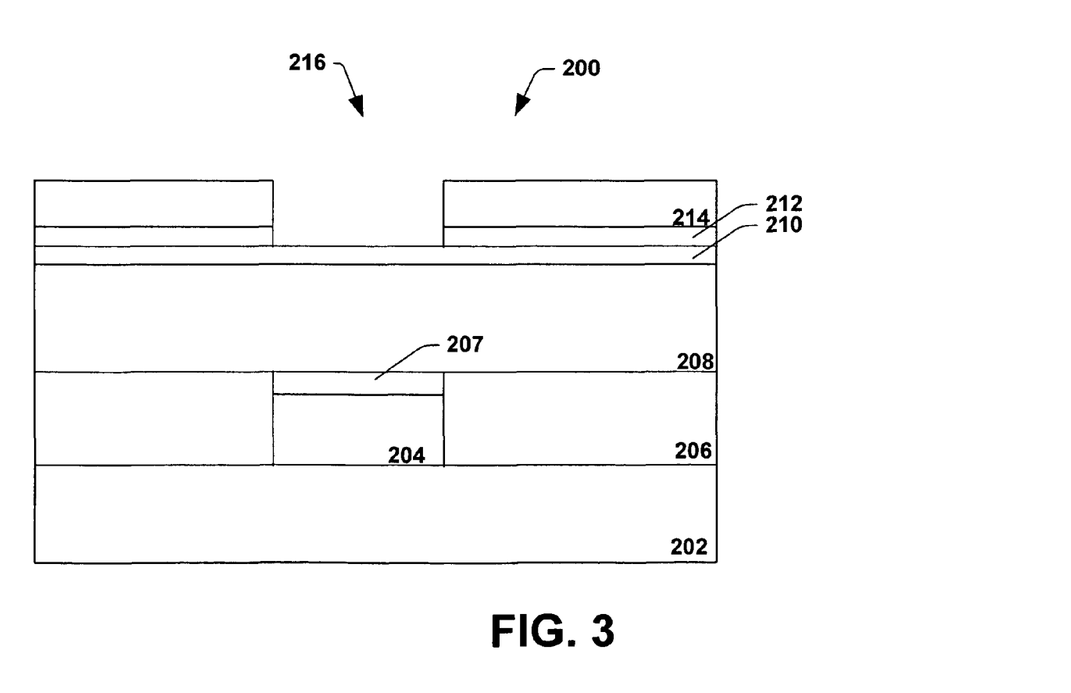
FIG. 3 illustrates a cross sectional illustration of a method of making a polymer memory cell in accordance with another aspect of the invention.

Referring to FIG. 3, a barrier layer 210 is formed over the copolymer layer 208. In some instances, some copolymer layers (depending upon the specific polymers employed) are susceptible to the undesirable permeation of oxygen and/or moisture. In these instances, an optional moisture and/or oxygen barrier layer may be deposited on the copolymer layer surface. The optional barrier layer serves to prevent at least a portion of the moisture and/or oxygen from penetrating into the copolymer layer, especially those portions that serve as a dielectric material. Examples of barrier layers include silicon oxide and silicon nitride. The barrier layer 210 has a thickness suitable to mitigate undesirable permeation of oxygen and/or moisture, such as from about 250 Å to about 2,000 Å, or from about 500 Å to about 1,500 Å. The barrier layer 210 is substantially translucent with regard to the subsequently employed actinic radiation.

An ARC 212 is formed over the barrier layer 210. The ARC 212 mitigates/prevents actinic radiation from contacting portions of the copolymer layer 208 that are to remain insulating. Any suitable material that substantially blocks the actinic radiation may be employed. That is, the patterned ARC 212 subsequently serves as a mask when irradiating the copolymer layer 208. The ARC 212 has a thickness suitable to mitigate undesirable exposure of the copolymer layer 208, such as from about 250 Å to about 2,000 Å, or from about 500 Å to about 1,500 Å. Examples of ARCs include silicon oxynitride, certain polymer ARCs, and refractory metal oxides. A resist 214 is formed over the ARC 212, and both the resist 214 and the ARC 212 are patterned using lithographic techniques. Patterning the resist 214 and the ARC 212 form openings 216 over the copolymer layer 208 that are at least partially aligned with the conductive electrodes 204.

Figure 4:
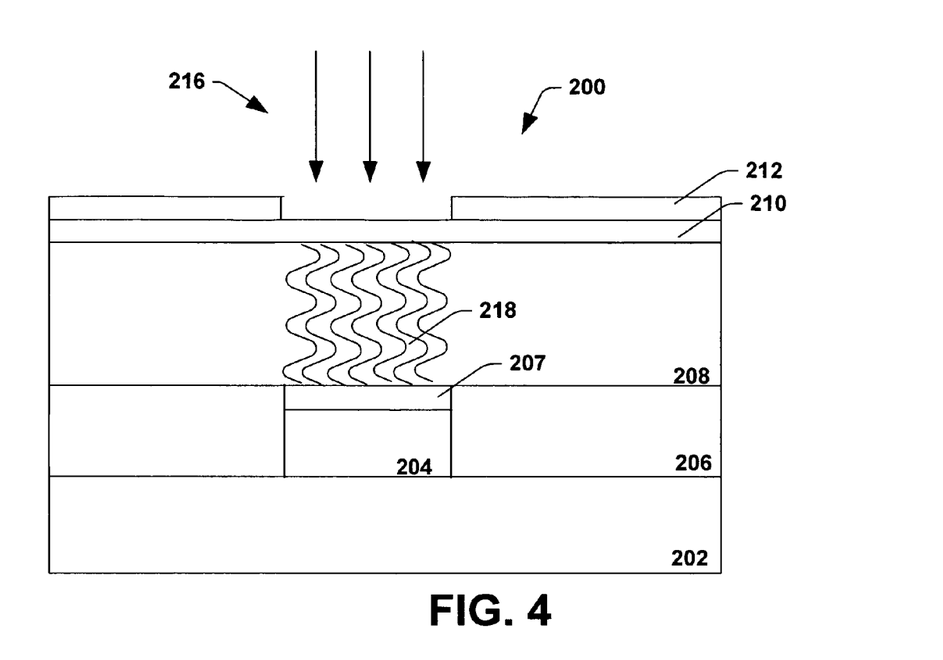
FIG. 4 illustrates a cross sectional illustration of a method of making a polymer memory cell in accordance with another aspect of the invention.

Referring to FIG. 4, actinic radiation is generated (shown by the arrows) and using ARC 212 as a mask to block unwanted radiation, portions of the copolymer layer 208 under the openings 216 are exposed to the actinic radiation. The actinic radiation induces chemical changes that result in the formation of semiconducting polymers 218 in the exposed portions of the copolymer layer 208. In the unexposed portions of the copolymer layer 208, dielectric properties are retained. Advantageously, the semiconducting polymers 218 are formed adjacent the copolymer layer 208 that is an electrical insulator.

Figure 5:
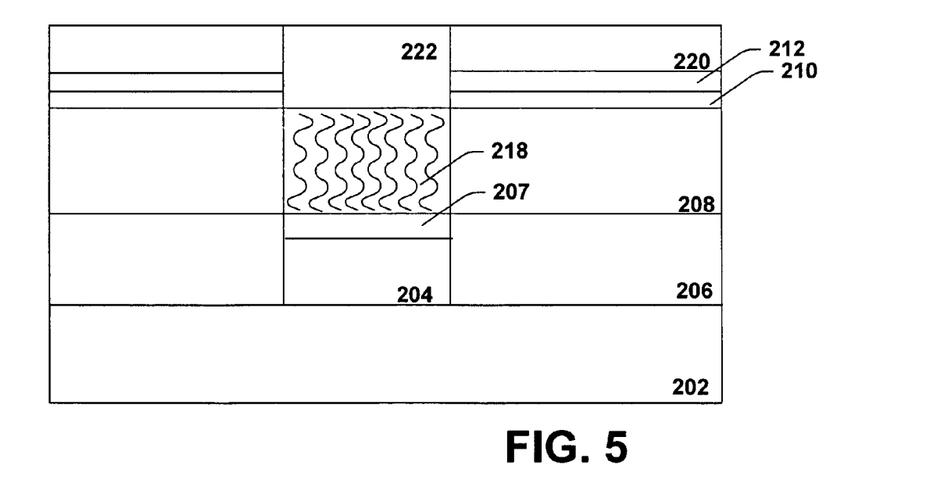
FIG. 5 illustrates a cross sectional illustration of a method of making a polymer memory cell in accordance with another aspect of the invention.

Referring to FIG. 5, completion of a polymer memory cell is shown. The portion of the barrier layer 210 over the semiconducting polymers 218 is removed (if necessary and appropriate, a patterned resist formed using lithographic techniques may be employed). A dielectric 220 is formed over the ARC 212, then patterned so that the dielectric has openings over the semiconducting polymers 218. A second electrode 222 is then formed in the opening and over/adjacent the semiconducting polymers 218. Peripheral structures and circuitry are not shown for brevity.

Examples of active devices of polymer memory devices include nonvolatile polymer memory cells, semiconducting polymer transistors, programmable polymer memory cells, and the like. Generally, these active devices contain an organic semiconductor between two electrodes, or an organic semiconductor surrounded by three electrodes. The integrated circuit chips described herein can be employed with logic devices such as central processing units (CPUs); as volatile memory devices such as DRAM devices, as SRAM devices, and the like; with input/output devices (I/O chips); and as non-volatile memory devices such as EEPROMs, EPROMs, PROMs, and the like.

The organic semiconductor devices with polymer dielectrics and semiconducting polymers are useful in any device requiring memory. For example, the organic semiconductor devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the polymer memory devices and polymer dielectrics. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a memory device, comprising:
   providing a first electrode within an insulating material;
   forming a passive layer above the first electrode;
   forming a copolymer layer above the first electrode, passive layer, and insulating material, the copolymer layer comprising a polymer dielectric and a semiconducting polymer precursor, the copolymer layer having dielectric properties;

exposing a portion of the copolymer layer to actinic radiation thereby forming a semiconducting polymer in the exposed portion of the copolymer layer; and forming a second electrode aligned above the exposed portion of the copolymer layer comprising the semiconducting polymer, wherein the semiconducting polymer precursor forms the semiconducting polymer in response to exposure to the actinic radiation.

2. The semiconductor device of claim 1, wherein the polymer dielectric comprises at least one selected from the group consisting of polyimides, fluorinated polyimides, polysilsequioxanes such as hydrogen polysilsequioxanes, methyl polysilsequioxanes, butyl polysilsequioxanes, phenyl polysilsequioxanes, benzocyclobutenes (BCB), fluorinated benzocyclobutene, polyphenylene, polysilazanes, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fuorinated poly(arylene ether), fluorinated parylenes, poly(p-xylxylenes), fluorinated poly(p-xylxylenes), parylene F, parylene N, parylene C, parylene D, amorphous polytetrafluoroethylene, polyquinoline, polyphenylquinoxalines, and polymeric photoresist materials.

3. The semiconductor device of claim 1, wherein the copolymer layer contains from about 50% to about 90% by weight of a polymer dielectric and from about 10% to about 50% by weight of the semiconducting polymer precursor.

4. The semiconductor device of claim 1, wherein unexposed portions of the copolymer layer have a dielectric constant below about 3.

5. The semiconductor device of claim 1, wherein the copolymer layer is formed by depositing a mixture by spin-on techniques.

6. The semiconductor device of claim 5, wherein the mixture contains from about 0.1% to about 75% by weight of copolymer material and from about 25% to about 99.9% by weight of solvent.

7. The semiconductor device of claim 1, wherein the semiconducting polymer comprises at least one selected from the group consisting of polyacetylene, polydiphenylacetylene, poly(t-butyl)diphenylacetylene, poly(trifluoromethyl)diphenylacetylene, polybis(trifluoromethyl)acetylene, polybis(t-butyldiphenyl)acetylene, poly(trimethylsilyl) diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitro-phenylacetylene, poly(trifluoromethyl)phenylacetylene, poly(trimethylsilyl) pheylacetylene, polydipyrrylmethane, polyindoqiunone, polydihydroxyindole, polytrihydroxyindole, furane-polydihydroxyindole, polyindoqiunone-2-carboxyl, polyindoqiunone, polybenzobisthiazole, poly(p-phenylene sulfide), polyaniline, polythiophene, polypyrrole, polysilane, polystyrene, polyfuran, polyindole, polyazulene, polyphenylene, polypyridine, polybipyridine, polyphthalocyanine, polysexithiofene, poly(siliconoxohemiporphyrazine), poly(germaniumoxohemiporphyrazine), poly(ethylenedioxythiophene); polymetallocene complexes, and polypyridine metal complexes.

8. The semiconductor device of claim 1, wherein the passive layer comprises at least one selected from the group consisting of copper sulfide, copper rich copper sulfide, copper oxide, copper selenide, copper telluride, manganese oxide, titanium dioxide, indium oxide, silver sulfide, gold sulfide, iron oxide, cobalt arsenide, and nickel arsenide.

9. The semiconductor device of claim 1, wherein the actinic radiation has a wavelength from about 1 nm to about 1,000 nm.

10. A method of making a polymer memory device, comprising:

providing a first electrode within an insulating material;

forming a passive layer above the first electrode;

forming a copolymer layer above the first electrode, passive layer, and insulating material, the copolymer layer comprising a polymer dielectric and a semiconducting polymer precursor, the copolymer layer having dielectric properties;

patterning an ARC above the copolymer layer so that openings in the ARC are positioned at least partially aligned above the first electrode;

exposing a portion of the copolymer layer through openings in the ARC to actinic radiation thereby forming a semiconducting polymer in the exposed portion of the copolymer layer; and forming a second electrode aligned above the exposed portion of the copolymer layer comprising the semiconducting polymer, wherein the semiconducting polymer precursor forms the semiconducting polymer in response to exposure to the actinic radiation.

11. The semiconductor device of claim 10, wherein the polymer dielectric comprises at least one selected from the group consisting of polyimides, fluorinated polyimides, polysilsequioxanes such as hydrogen polysilsequioxanes, methyl polysilsequioxanes, butyl polysilsequioxanes, phenyl polysilsequioxanes, benzocyclobutenes (BCB), fluorinated benzocyclobutene, polyphenylene, polysilazanes, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fuorinated poly(arylene ether), fluorinated parylenes, poly(p-xylxylenes), fluorinated poly(p-xylxylenes), parylene F, parylene N, parylene C, parylene D, amorphous polytetrafluoroethylene, polyquinoline, polyphenylquinoxalines, and polymeric photoresist materials.

12. The semiconductor device of claim 10, wherein the ARC has thickness from about 250 Å to about 2,000 Å.

13. The semiconductor device of claim 10, wherein the copolymer layer is formed by spin-on techniques, and unexposed portions of the copolymer layer have a dielectric constant below about 2.4.

14. The semiconductor device of claim 10, wherein the actinic radiation has a wavelength from about 100 nm to about 500 nm.

15. The semiconductor device of claim 10, wherein the semiconducting polymer comprises at least one selected from the group consisting of polyacetylene, polydiphenylacetylene, poly(t-butyl)diphenylacetylene, poly(trifluoromethyl) diphenylacetylene, polybis(trifluoromethyl)acetylene, polybis(t-butyldiphenyl)acetylene, poly(trimethylsilyl) diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitro-phenylacetylene, poly(trifluoromethyl)phenylacetylene, poly(trimethylsilyl) pheylacetylene, polydipyrrylmethane, polyindoqiunone, polydihydroxyindole, polytrihydroxyindole, furane-polydihydroxyindole, polyindoqiunone-2-carboxyl, polyindoqiunone, polybenzobisthiazole, poly(p-phenylene sulfide), polyaniline, polythiophene, polypyrrole, polysilane, polystyrene, polyfuran, polyindole, polyazulene, polyphenylene, polypyridine, polybipyridine, polyphthalocyanine, polysexithiofene, poly(siliconoxohemiporphyrazine), poly(germaniumoxohemiporphyrazine), poly(ethylenedioxythiophene), polymetallocene complexes, and polypyridine metal complexes.

16. The method of claim 10, wherein the passive layer comprises at least one selected from the group consisting of copper sulfide, copper rich copper sulfide, copper oxide, copper selenide, copper telluride, manganese oxide, titanium dioxide, indium oxide, silver sulfide, gold sulfide, iron oxide, cobalt arsenide, and nickel arsenide.

17. A method of making a polymer memory device, comprising:

providing a first electrode within an insulating material;

forming a passive layer above the first electrode;

forming a copolymer layer above the first electrode, passive layer, and insulating material, the copolymer layer comprising a polymer dielectric and a semiconducting polymer precursor, the copolymer layer having dielectric properties;

forming a barrier layer aligned above the copolymer layer;

patterning an ARC above the barrier layer so that openings in the ARC are positioned at least partially aligned above the first electrode;

exposing a portion of the copolymer layer through openings in the ARC and through the barrier layer to actinic radiation thereby forming a semiconducting polymer in the exposed portion of the copolymer layer;

removing a portion of the barrier layer at least from partially above the exposed portion of the copolymer layer; and forming a second electrode aligned above the exposed portion of the copolymer layer comprising the semiconducting polymer, wherein the semiconducting polymer precursor forms the semiconducting polymer in response to exposure to the actinic radiation.

18. The semiconductor device of claim 17, wherein the barrier layer has thickness from about 250 Å to about 2,000 Å, and the barrier layer is substantially translucent to the actinic radiation.

19. The semiconductor device of claim 17, wherein the barrier layer comprises at least one of silica and silicon nitride.

20. The semiconductor device of claim 17, wherein the polymer dielectric comprises a low k polymer material.

* * * * *